(12) United States Patent
Nakamura

(10) Patent No.: US 7,249,510 B2
(45) Date of Patent: Jul. 31, 2007

(54) SEMICONDUCTOR ACCELERATION SENSOR AND MANUFACTURING METHOD THEREOF

(75) Inventor: Akio Nakamura, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 11/244,041

(22) Filed: Oct. 6, 2005

(65) Prior Publication Data

US 2006/0070444 A1  Apr. 6, 2006

(30) Foreign Application Priority Data

Oct. 6, 2004  (JP) .............................. 2004-293257

(51) Int. Cl.
G01P 15/12  (2006.01)
G01P 21/00  (2006.01)

(52) U.S. Cl. ................................. 73/514.33; 73/514.29

(58) Field of Classification Search ............. 73/514.33, 73/514.34, 514.29, 514.36, 514.38, 514.16; 338/2, 5, 43, 46

See application file for complete search history.

(56) References Cited

U.S. PATENT DOCUMENTS

| 5,295,386 A | * | 3/1994 | Okada .......................... 73/1.07 |
| 5,490,421 A | * | 2/1996 | Ueyanagi .................. 73/514.33 |
| 5,567,880 A | * | 10/1996 | Yokota et al. ............ 73/514.33 |

FOREIGN PATENT DOCUMENTS

| JP | 05-264575 |   | 10/1993 |
| JP | 6-242139  | * | 9/1994  |
| JP | 7-005192  | * | 1/1995  |
| JP | 8-054413  | * | 2/1996  |

* cited by examiner

Primary Examiner—Helen Kwok
(74) Attorney, Agent, or Firm—Rabin & Berdo, PC

(57) ABSTRACT

A semiconductor acceleration sensor in which a reduction in size can be achieved when electrodes are formed in a chip main body and acceleration can be measured with good sensitivity. The semiconductor acceleration sensor comprises a weight section, flexible sections which support the weight section and have measurement elements P, and a chip main body which has a front surface having chip electrodes electrically connected with the measurement elements, and support the flexible sections, wherein an additional weight, which has an inclined face which surrounds a bonding section and decreases its size toward the bonding section, is bonded on the front surface of the weight section.

8 Claims, 9 Drawing Sheets

SEMICONDUCTOR ACCELERATION SENSOR AND MANUFACTURING METHOD THEREOF

BACKGROUND OF THE INVENTION

1. Field of the Invention

The present invention relates to a semiconductor. acceleration sensor which is mounted on transportation equipment, such as an automobile and airplane, and is used for measuring acceleration and collision thereof, and a manufacturing method thereof.

2. Description of the Related Art

A conventional semiconductor acceleration sensor, comprises a weight section that is an hemispheric-shaped solder attached to a function section supported by flexible sections created on a silicon substrate, and measures acceleration by detecting the change of piezo-resistors created in the flexible sections by aluminum wires (e.g. Japanese Patent Kokai No. H5-264575 (page 2, paragraphs 0006, 0007, and page 3, paragraphs 0017-0020, FIG. 1, FIG. 8)).

In order to fetch signals from the semiconductor acceleration sensor to the outside, normally it is necessary to create electrodes connected to the acceleration measurement elements, and wire them with a terminals connected to the outside using bonding wires. In the above mentioned prior art, it is necessary to create an electrode on a silicon substrate in order to detect the change of the piezo-resistor by aluminum wire, and fetch the signals to the outside, but the shape of the weight section is hemispheric, and the maximum area section thereof is bonded with the function section, so securing an area for creating the electrodes increases the size of the semiconductor acceleration sensor, which is a problem.

SUMMARY OF THE INVENTION

Solving the above problem in view, it is an object of the present invention to provide a means for allowing downsizing when electrodes are formed on a chip main body of the semiconductor acceleration sensor, and measuring acceleration with good sensitivity.

To achieve the above object, the present invention is a semiconductor acceleration sensor, comprising a weight section which has a first surface, flexible sections which support the weight section and have measurement elements, and a chip main body which has a second surface having chip electrodes electrically connected with the measurement elements and supports the flexible sections, and further comprising a bonding section provided on the first surface of the weight section, and an additional weight, which has an inclined face which surrounds the bonding section and which reduces (size) toward the bonding section.

The manufacturing method for the semiconductor acceleration sensor comprises steps of: providing a weight section which has a first surface, flexible sections which support the weight section and have measurement elements, and chip electrodes which are electrically connected with the measurement elements on a second surface of a chip main body, on a wafer; bonding a back plate on the back surface of the wafer; and covering the first surface of the wafer, to which the back plate is bonded, with a protective plate on which cutting guide slits are formed, and separating the wafer, on which the back plate is bonded, into individual dies along the cutting guide slits.

Since an additional weight, having an inclined face which reduces size toward the bonding section, is bonded to the front surface (first surface) of the weight section of the chip main body, the present invention can decrease the area of the bonding section on the front surface of the weight section, and can implement a semiconductor acceleration sensor which can measure acceleration with good sensitivity, even when the chip electrodes are formed on the chip main body of the semiconductor acceleration sensor.

Also when the wafer is separated into dies, the front surface of the wafer is covered by a protective plate, on which the cutting guide slits are formed, and then separated, so damage to the flexible sections during manufacture can be prevented by avoiding an external force applied to the flexible section due to a cutting solution.

DETAILED DESCRIPTION OF THE INVENTION

An embodiment of the semiconductor acceleration sensor according to the present invention will now be described with reference to the drawings.

Figure 1:
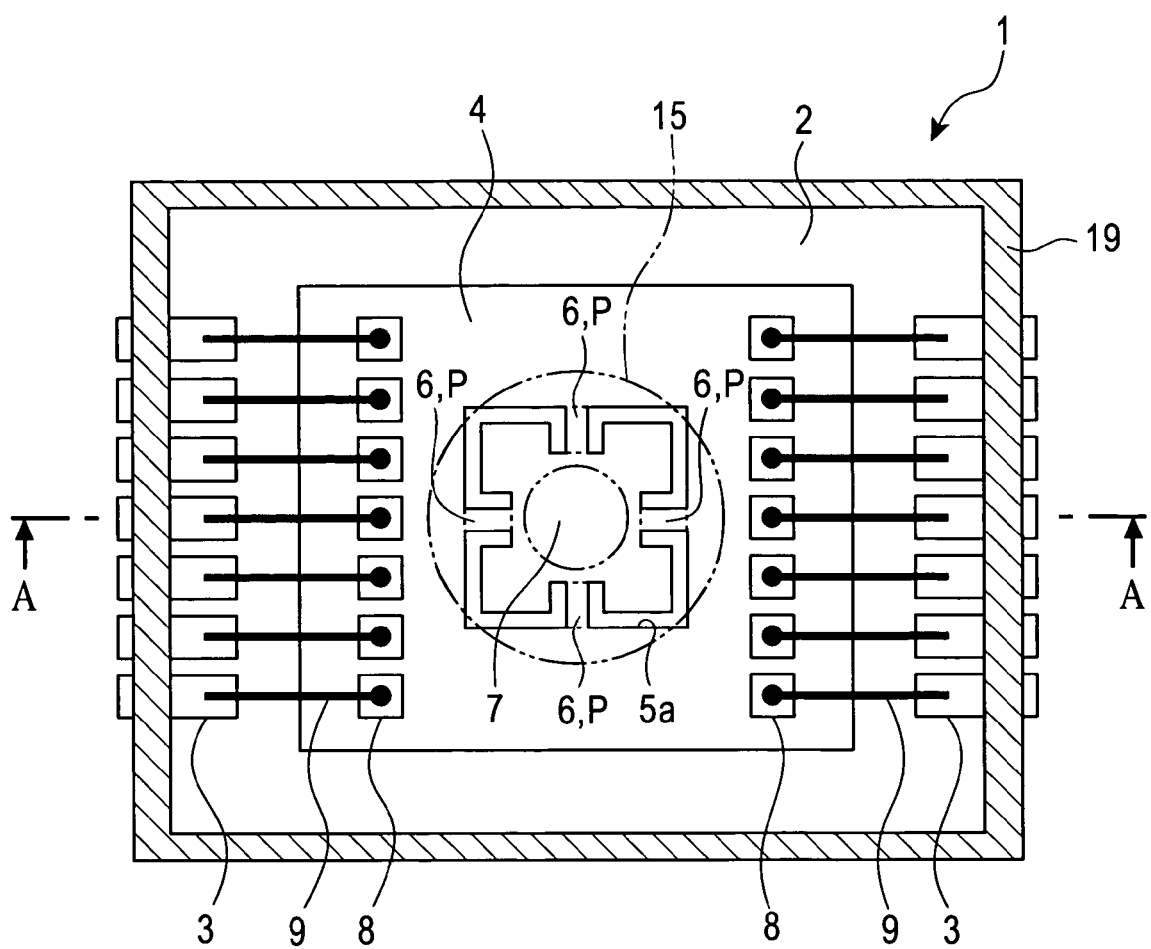
FIG. 1 is a top view depicting the semiconductor acceleration sensor according to Embodiment 1.
Figure 2:
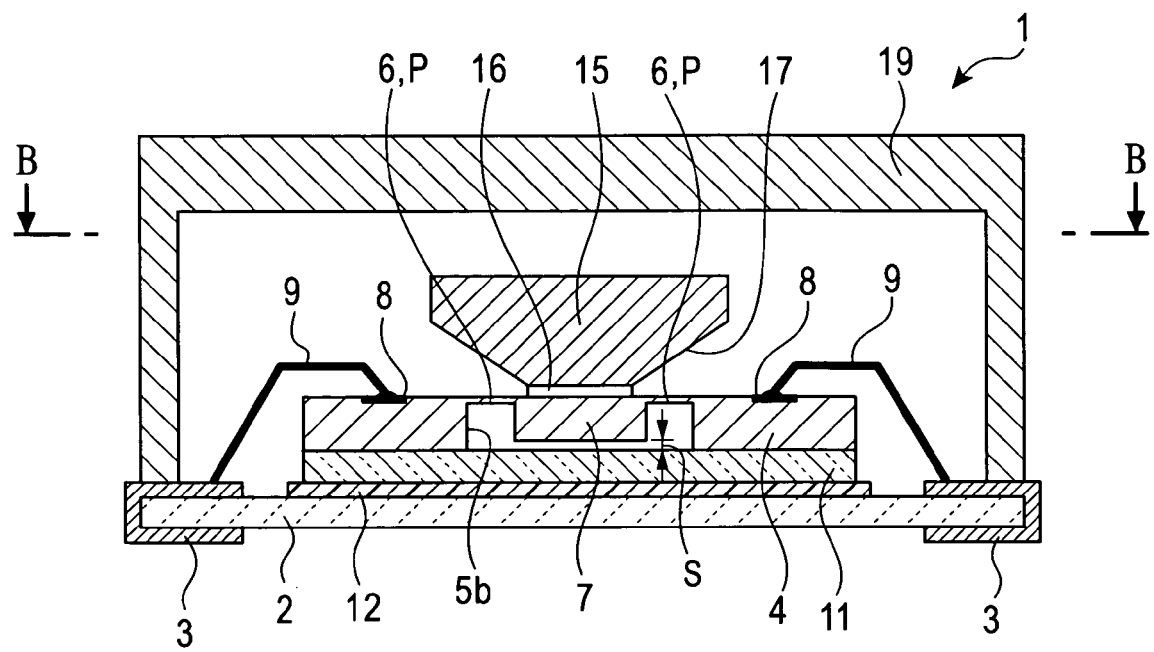
FIG. 2 is the A-A cross-sectional view of FIG. 1.
Figure 3:
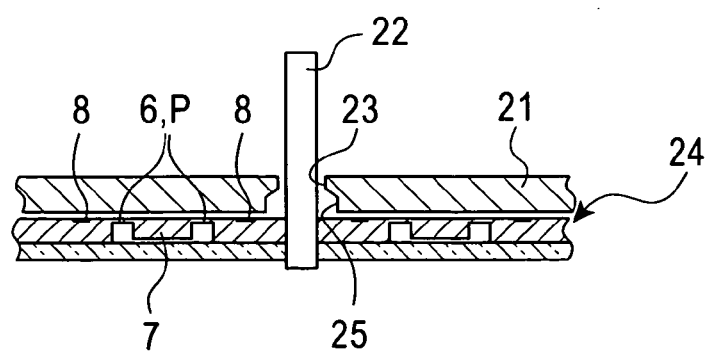
FIG. 3 is a top view depicting the protective plate of Embodiment 1.

FIG. 1 is a top view depicting the semiconductor acceleration sensor of Embodiment 1, FIG. 2 is the A-A cross-sectional view of FIG. 1, and FIG. 3 is a cross-sectional view depicting the protective plate of Embodiment 1. In FIG. 1, the additional weight is omitted, shown merely by a two-dot chain line, which is the B-B cross-sectional view of FIG. 2.

In FIG. 1 and FIG. 2, 1 is a semiconductor acceleration sensor.

2 is a substrate made of a ceramic plate, and a plurality of terminals 3, for fetching signals to the outside, are disposed on both ends thereof.

4 is a chip main body, formed by separating the later mentioned wafer 24 into dies. Slits 5a of a square shape are formed penetrating the center area of the chip main body 4 substantially in a square shape, leaving a portion of the four sides of the slit 5a of the square shape at the center of the chip main body 4, by anisotropic etching for example. Flexible sections 6, which have flexibility, are created by engraved sections 5b, which are the portions engraved on the back side of the remaining center portion. The portion enclosed by the slit 5a and the engraved sections 5b on the back side of the flexible sections 6 is formed as the weight section 7.

In a flexible section 6 made of silicon, a measurement element P, which is a bridge circuit created by a piezo-resistance element formed by adding impurities into the flexible section for diffusion, is formed respectively to measure the displacement of the flexible section 6 as acceleration using the change of electric characteristics.

8 is a chip electrode made of aluminum for example, and a plurality of them are formed on both sides on the front surface (second surface) of the chip main body 4 at positions near the inclined face 17 of the additional weight 15, which will be described later, and the chip electrodes 8 and the measurement elements P of the flexible sections 6 are electrically connected internally by ohmic contact, for example, and the chip electrodes 8 and the terminals 3 formed on the substrate 2 are electrically connected by metal bonding wires 9.

11 is a glass plate as a back plate, which is bonded to the back surface (fourth surface) of the chip main body 4 by anode bonding, for example, extending under the weight section 7, and creates a space, indicated by S in FIG. 2, between the front surface of the glass plate 11 and the back surface (third surface) of the weight section 7, and the back surface of the glass plate 11 is bonded to the substrate 2 by adhesive 12. By this, the chip main body 4 is secured to the substrate 2 via the glass plate 11.

The space S is set to a value with which the flexible sections 6 are not damaged by deflection, that is, the space S prevents damage to the flexible sections 6 by limiting the amplitude of the flexible sections 6 generated by acceleration.

The glass plate 11 may cover the entire back surface of the weight section 7, or may cover a part thereof.

15 is an additional weight, which is a weight element made from a metal of which density is relatively high, such as gold, platinum, silver, tungsten and lead, and is secured to the front surface (first surface) of the weight section 7 of the chip main body 4 by bonding with an adhesive 16.

The additional weight 15 is formed in a combined shape of a cylinder section and circular cone base section, having an inclined face 17 which surrounds the bonding section with the weight section 7 disposed at one end of the cylinder and reduces its size toward the bonding section, that is a shape of which the bonding section with the weight section 7 has a minimum area, and the bottom face of the additional weight section 15, which is the minimum area section, is bonded to the front surface of the weight section 7. Because of this, the bottom surface of the additional weight 15 and the front face of the weight section 7 are bonded near the flexible sections 6.

19 is a cover unit, which is a box element without a bottom face, manufactured with a thin plate, such as ceramic, metal and resin material, and the bases of the four side plates are bonded to the substrate 2, so that the space created thereby can contain the chip main body 4 and the additional weight 15, and protects the elements from the entry of dust from the outside, and prevents the damage of flexible sections 6 by external force.

In FIG. 3, 21 is a protective plate which is a plate element where the cutting guide slits 23, of which width is larger than the thickness of the blade 22, are formed on such a plate material as metal or resin, and has a function to protect the flexible sections 6 formed on the wafer 24 from external force by the cutting solution, such as water, to be sprayed for removing cutting dust or for cooling when the wafer 24, which is mono-crystal silicon created into thin plates in the later mentioned manufacturing steps, is cut.

25 is a notch section, which is cut from both corner sections of the cutting guide slits 23 in the longitudinal direction at the wafer side 24 to have roughly a trapezoidal cross-section, so as to prevent splashing of cutting solution when the wafer 24 is cut.

The protective plate 21 may be one plate on which the cutting guide slits 23 are formed, or may be a combination of a pair of plate elements in which the cutting guide slits 23 are cut in the longitudinal direction.

The functions of the above configuration will now be described.

The manufacturing steps of the semiconductor acceleration sensor 1 will be described below with reference to FIG. 4 to FIG. 9.

Figure 4:
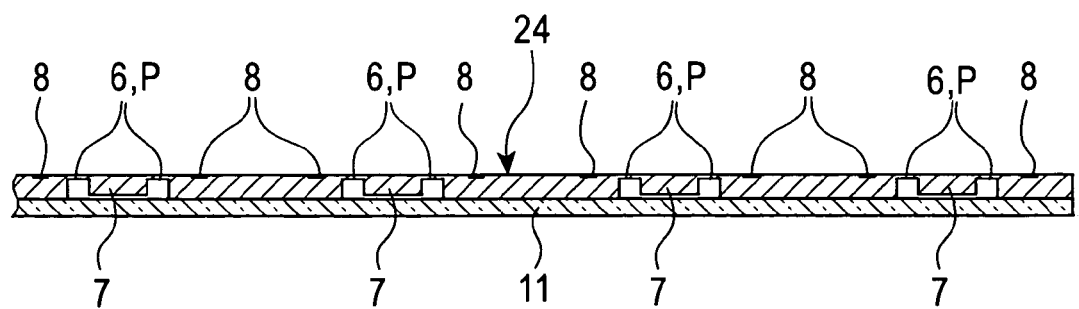
FIG. 4 is a diagram depicting the manufacturing step A of the semiconductor acceleration sensor according to Embodiment 1.

In step A, as FIG. 4 shows, the slit 5a is formed at a plurality of locations to become an individual chip main body 4 of the wafer 24 by anisotropic etching, the flexible sections 6 are formed by the engraved section 5b, that is the remaining center portion of which the back side is engraved, the weight section 7 is formed by the slit 5a and the engraved sections 5b, the measurement elements P, for measuring acceleration, are formed at predetermined locations in the flexible sections 6 respectively by adding and diffusing impurities, chip electrodes 8, which are internally connected with the measurement elements P, are formed on the front surface of the wafer 24, and the wafer 24, on which a plurality of chip main bodies 4 are formed, is thus manufactured. And on the back surface of the wafer 24, on which a plurality of chip main bodies 4 are formed, the glass plate 11 is bonded by anode bonding, for example.

Figure 5:
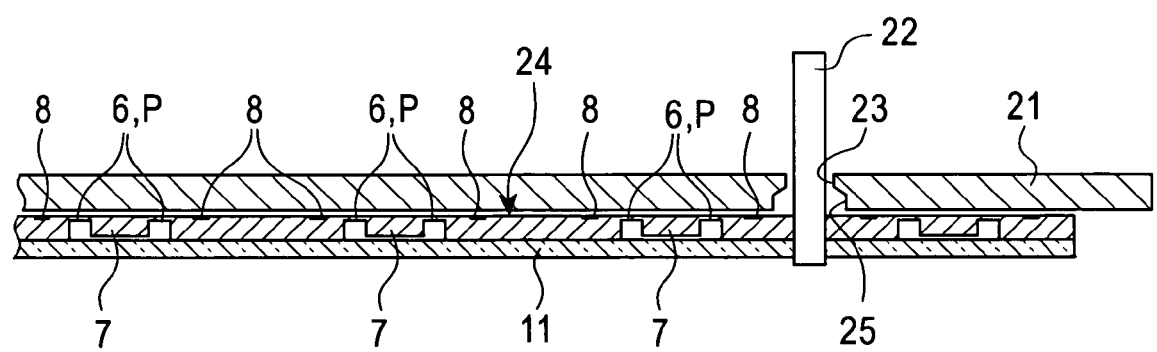
FIG. 5 is a diagram depicting the manufacturing step B of the semiconductor acceleration sensor according to Embodiment 1.

In step B, as FIG. 5 shows, the front surface of the wafer 24, to which the glass plate 11 is bonded, is covered with the protective plate 21 on which the cutting guide slits 23 are formed, and the wafer 24, on which the glass plate 11 is bonded, is cut by a blade 22 rotating at high-speed, and is separated into dies along the cutting guide slits 23 while spraying cutting solution into the cutting guide slits 23, and as a result the chip main bodies 4, where the glass plate 11 is bonded on the back surface, are cut out.

In this case, the wafer 24 is secured in a dividing device which can divide in X-Y directions and in a rotating direction, where the wafer 24 is first cut into a plurality of rectangular pieces by the blade 22 moving the wafer intermittently for a predetermined distance in the X direction, then the wafer is rotated 90 degrees, and is divided into dies while moving the wafer intermittently for a predetermined distance, as mentioned above.

The cutting solution and cutting dust generated during cutting by the blade 22 are received by the notches 25 of the protective plate 21 and discharged, so the splashing of the cutting solution and cutting dust can be suppressed, and the blade 22 can be effectively cooled down with a small amount of cutting solution, and also the attachment of splashed cutting dust to other locations can be prevented since the protective plate 21 covers areas other than the cutting location.

The protective plate 21, which covers areas other than the cutting locations of the wafer 24, protects from external force, due to the sprayed cutting solution which is applied to the flexible sections 6 formed on the wafer 24, so damage to the flexible section 6 can be prevented.

Figure 6:
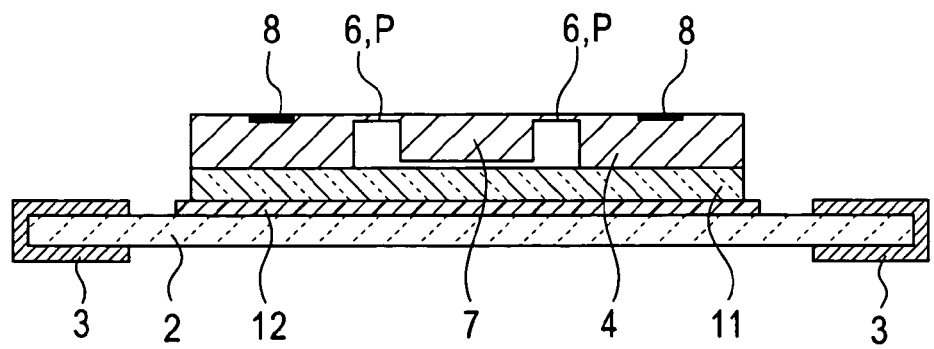
FIG. 6 is a diagram depicting the manufacturing step C of the semiconductor acceleration sensor according to Embodiment 1.

In step C, as FIG. 6 shows, an individually separated chip main body 4, on which the glass plate 11 is bonded, is bonded roughly at the center of the substrate 2, having a plurality of terminals 3, by adhesive 12.

Figure 7:
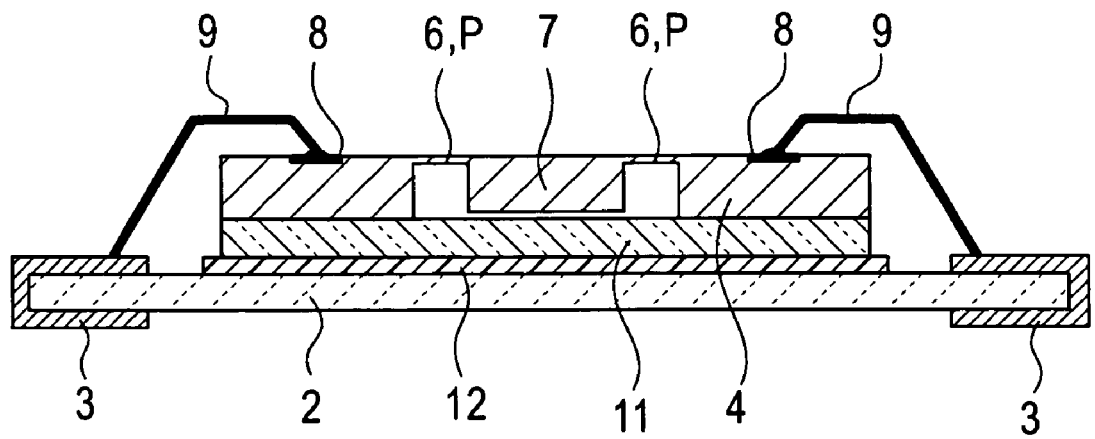
FIG. 7 is a diagram depicting the manufacturing step D of the semiconductor acceleration sensor according to Embodiment 1.

In step D, as FIG. 7 shows, the chip electrodes 8, formed on the front surface of the chip main body 4 bonded to the substrate 2 via the glass substrate 11, and the terminals 3 of the substrate 2, are connected with bonding wires 9 using a wire bonder, for example.

Figure 8:
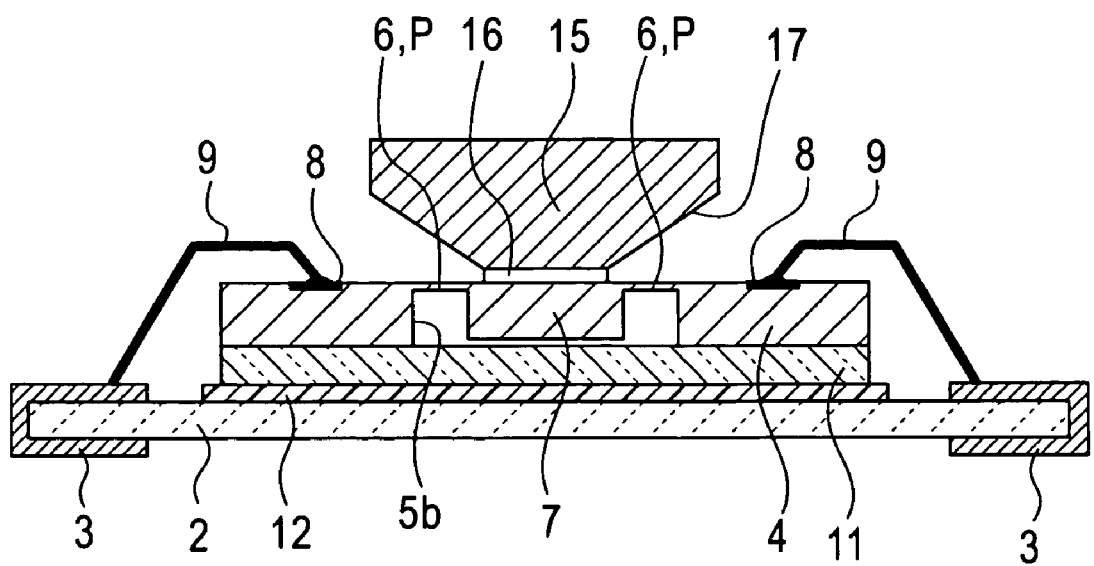
FIG. 8 is a diagram depicting the manufacturing step E of the semiconductor acceleration sensor according to Embodiment 1.

In step E, as FIG. 8 shows, after the terminals 3 of the substrate 2 and the chip electrodes 8 are connected, the bottom face at the tip of the inclined face 17 of the additional weight 15, that is the minimum area section, is bonded to the front surface of the weight section 7 of the chip main body 4 using adhesive 16.

In this case, the additional weight 15 can be bonded to the weight section 7 in the minimum area section created by the inclined face 17, to be near the flexible sections 6, so the space between the flexible sections 6, formed in the chip main body 4, can be decreased, in other words, the area of the front surface of the weight section 7, for connecting to the additional weight 15, can be decreased, and the distance between the chip electrodes 8 formed on both sides of the chip main body 4 can be decreased, so the chip main body 4 can be downsized, and the cover unit 19, which is bonded in the next step, can be downsized.

In step F, the bottom faces of the side plates of the cover unit 19 are bonded to the substrate 2, the chip main body 4 and the additional weight 15 are contained in the space created by the cover unit 19 and the substrate 2, and manufacture of the semiconductor acceleration sensor 1 shown in FIG. 2 is completed.

With the semiconductor acceleration sensor 1 manufactured in this way, where an additional weight 15 of which density is relatively high is bonded to the front surface of the weight section 7, acceleration and shock can be measured with good sensitivity.

In the above description, the shape of the additional weight 15 is a shape where the inclined face of a circular cone is formed on one edge of a cylinder, but the shape of the additional weight 15 is not limited to the above, but may have a shape where each side face of a regular prism, such as a regular quadrangular prism and regular hexagonal prism, is an inclined face 17 of which the size reduces toward the bonding section, or the inclined face 17 of the circular cone may be formed on one edge of the regular prism.

In this way, compared with the additional weight 15 in an hemispheric shape, an additional weight 15 with the same weight can be implemented with a smaller bonding section area and smaller size, and compared with the additional weight 15 manufactured simply as a cylinder or regular prism, the area of the bonding section can be decreased, and the size of the chip main body 4 can be decreased.

As described above, according to the present embodiment, the additional weight, where an inclined face reducing its size toward the bonding section is formed, is bonded on the front surface of the weight section of the chip main body, so the area of the bonding section on the front face of the weight section can be decreased, and even when chip electrodes are formed on the chip main body of the semiconductor acceleration sensor, a downsized semiconductor acceleration sensor, that can measure acceleration with good sensitivity, can be implemented.

Also the glass plate is bonded on the back surface of the chip main body, and the space S is provided between the glass plate and the back surface of the weight section, the deflection amount of the flexible sections can be restricted, and damage to the flexible sections caused by acceleration measurement can be prevented.

Also the chip electrodes are formed near the inclined face created on the additional weight, and the chip electrodes and the terminals of the substrate are connected by bonding wires, so downsizing of the chip main body and downsizing of the semiconductor acceleration sensor can be implemented.

Also in the step of separating the wafer into dies, the wafer is separated after the front surface of the wafer is covered with the protective plate, on which cutting guide slits are formed, so applying an external force of the cutting solution to the flexible sections is prevented, and the damage to the flexible sections during manufacturing can be prevented.

Also the notch sections are formed on the wafer side of the cutting guide slits of the protective plate, so the splashing of the cutting solution and cutting dust by the blade are received by the notch sections 25, and are discharged, so the splashing of the cutting solution can be suppressed, and the blade can be effectively cooled down with a small amount of cutting solution.

Also after the step of wiring the chip electrodes of the chip main body and the terminals of the substrate by bonding wires, the minimum area section of the additional weight is bonded on the front surface of the weight section, so the wiring by bonding wires can be performed easily.

Figure 9:
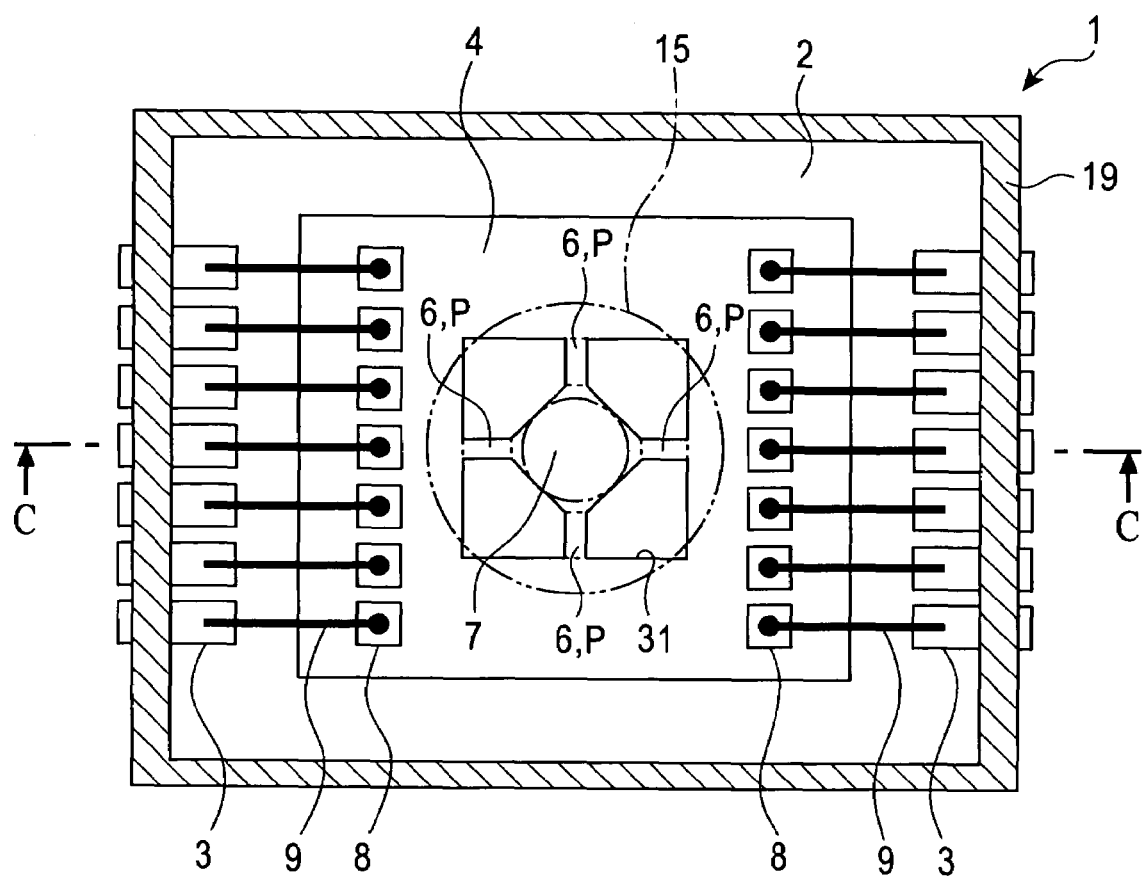
FIG. 9 is a top view depicting the semiconductor acceleration sensor according to Embodiment 2.
Figure 10:
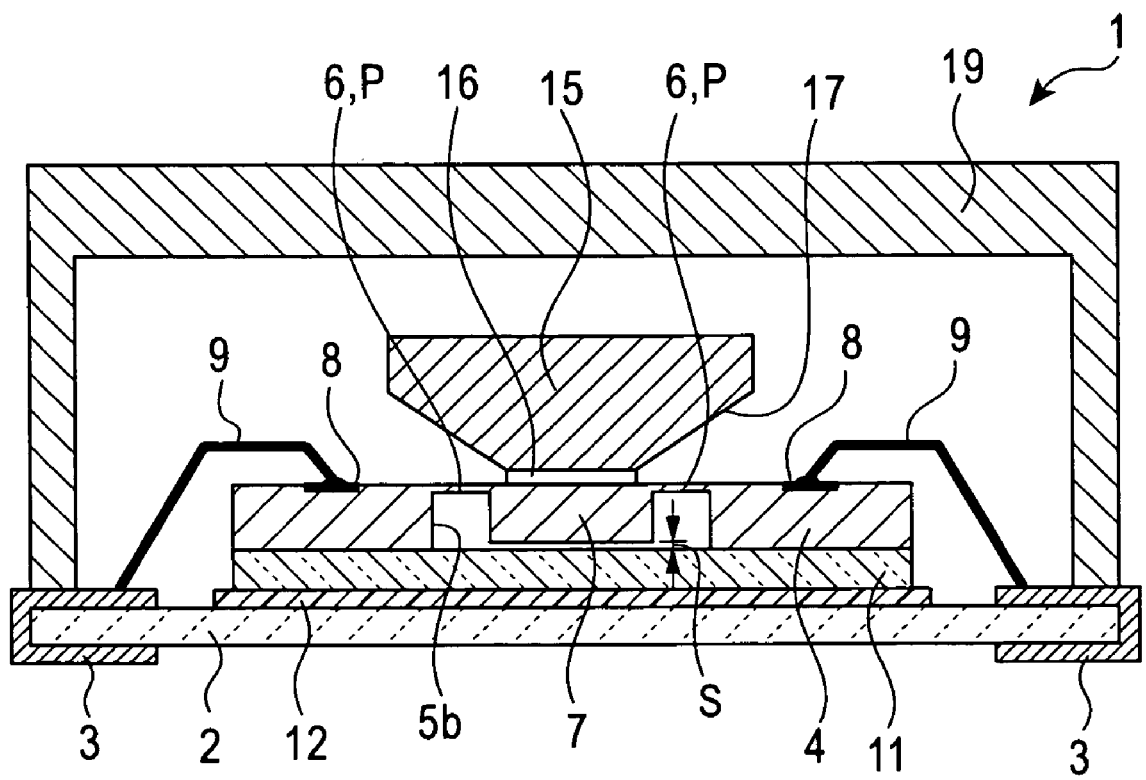
FIG. 10 is the C-C cross-sectional view of FIG. 9.

FIG. 9 is a top view depicting the semiconductor acceleration sensor of Embodiment 2, and FIG. 10 is the C-C cross-sectional view of FIG. 9.

In FIG. 9, just like FIG. 1 of Embodiment 1, the additional weight is omitted, shown merely as a two-dot chain line. Composing elements the same as Embodiment 1 are denoted with the same reference symbols, for which description is omitted.

In the chip main body 4 of this embodiment, a cut out section 31, where four corners of the large square formed by the slits 5a in Embodiment 1, are cut out along the diagonal lines which cross diagonally on the outer diameter of the bonding section of the additional weight 15 and the weight section 7, that is, the bottom face as the bonding section with the additional weight 15, is formed by anisotropic etching, for example, leaving the section at the center of the large square, and the flexible sections 6 are created on the center part by creating engraved sections 5b, the same as in Embodiment 1, and a roughly quadrangular prism portion, having roughly a square cross-section externally contacting the bonding section surrounded by the diagonal lines of the cut out section 31 and the engraved sections 5b on the back side of the flexible sections 6, is formed as the weight section 7. By this, the weight section 7 can be created by cutting out the cut out section 31 having a relatively large area, where the distance between the weight section 7 and the chip main body 4 is longer compared with the width of the flexible section 6.

The function of the above structure will now be described.

The manufacturing steps of the present embodiment are the same as the manufacturing steps of the above mentioned Embodiment 1, so description thereof is omitted. In this case, the cut out section 31 is formed instead of the slit 5a in step A.

In the present embodiment, the weight section is formed roughly as a square, externally contacting the bonding section by the cut out section having a relatively wide area, instead of the relatively thin slits, so the weight section and the flexible sections can be easily formed on the chip main body in the etching step of forming the weight section, and dispersion of flexibility generated by the residue of etching can be decreased, and the flexibility of the flexible sections can be made uniform, in addition to effects similar to Embodiment 1.

Figure 11:
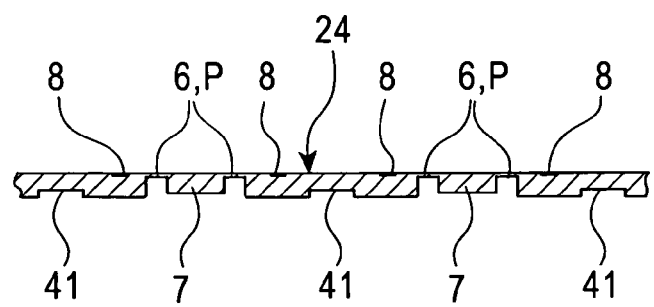
FIG. 11 is a partial cross-sectional view depicting the wafer according to Embodiment 3.

FIG. 11 is a cross-sectional view depicting the wafer of Embodiment 3.

FIG. 11 is a cross-sectional view similar to FIG. 2 of Embodiment 1. Composing elements the same as Embodiment 1 are denoted with the same reference symbols, for which description is omitted.

On the back surface of the waver 24 of the present embodiment, the cutting guide trenches 41 are formed along the cutting lines for separating the wafer 24 into dies by anisotropic etching, for example, and for cutting out the chip main body 4.

The configuration of the chip main body 4 of the present embodiment is the same as Embodiment 1.

The function of the above configuration will now be described.

The manufacturing steps of the semiconductor acceleration sensor 1 of the present embodiment will be described with reference to FIG. 12 to FIG. 18.

Figure 12:
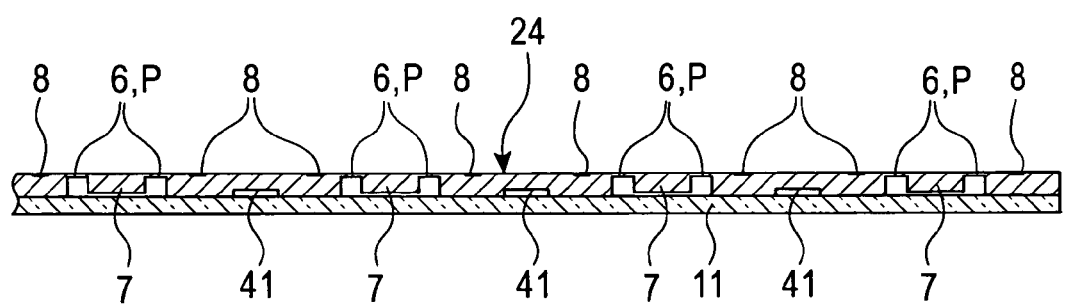
FIG. 12 is a diagram depicting the manufacturing step AA of the semiconductor acceleration sensor according to Embodiment 3.

In step AA, as FIG. 12 shows, a wafer 24, on which a plurality of chip main bodies 4 are formed, is manufactured in the same way as step A in Embodiment 1, and the glass plate 11 is bonded on the back surface of the wafer 24. In this case, the cutting guide trenches 41 are formed on the back surface of the wafer 24 when the weight section 7 is formed by creating the slit 5a and the flexible sections 6 by anisotropic etching, for example.

Figure 13:
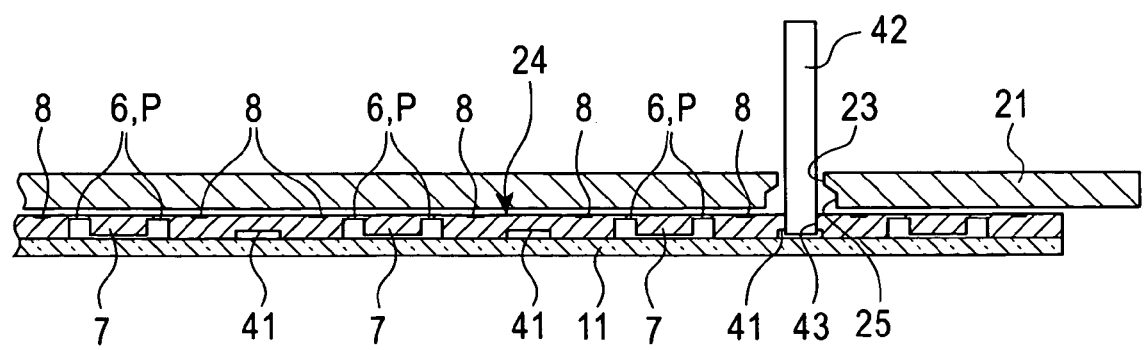
FIG. 13 is a diagram depicting the manufacturing step BA of the semiconductor acceleration sensor according to Embodiment 3.

In step BA, as FIG. 13 shows, the front surface of the wafer 24, on which the glass plate 11 is bonded, is covered with the protective plate 21 on which the cutting guide slits 23 are formed, and while spraying cutting solution into the cutting guide slits 23, the cutting trenches 43, reaching the cutting guide trenches 41, are formed by cutting the wafer 24 along the cutting guide slits 23 with the first blade 42, No. 2000 to 4000, which rotates at high-speed.

Figure 14:
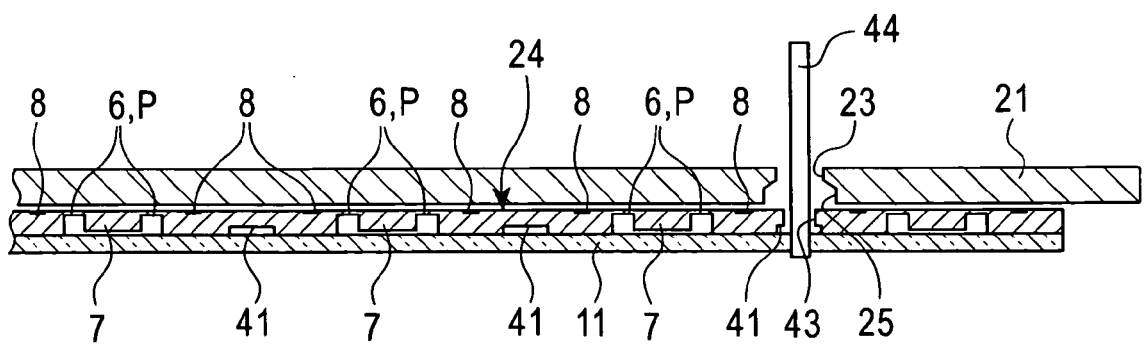
FIG. 14 is a diagram depicting the manufacturing step CA of the semiconductor acceleration sensor according to Embodiment 3.

In step CA, after the cutting trenches 43 are formed, the glass plate 11 is cut with the second blade 44, No. 600 to 1000, which thickness is thinner than the first blade 42, along the cutting trenches 43 from the front surface of the wafer 24, as shown in FIG. 14, and the chip main bodies 4, on which the glass plate 11 is bonded on the back surface, are separated as dies.

The wafer 24 in the cutting steps BA and CA is separated into dies while intermittently moving and rotary-moving, just like step B of the Embodiment 1.

In this case, the cutting guide trenches 41 are formed and the wafer 24 and the glass plate 11 are not cut with a same blade, but are cut separately using the first blade 42 and the second blade 44, so it is unnecessary to process the interface formed with hetero-materials, and peeling of the wafer 24 from the glass plate 11 can be prevented.

The functions of the protective plate 21 and the notch sections 25 are the same as Embodiment 1.

Figure 15:
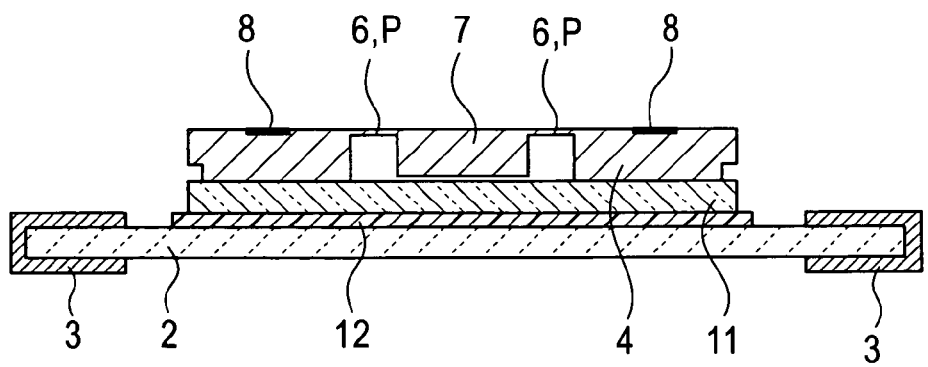
FIG. 15 is a diagram depicting the manufacturing step DA of the semiconductor acceleration sensor according to Embodiment 3.
Figure 16:
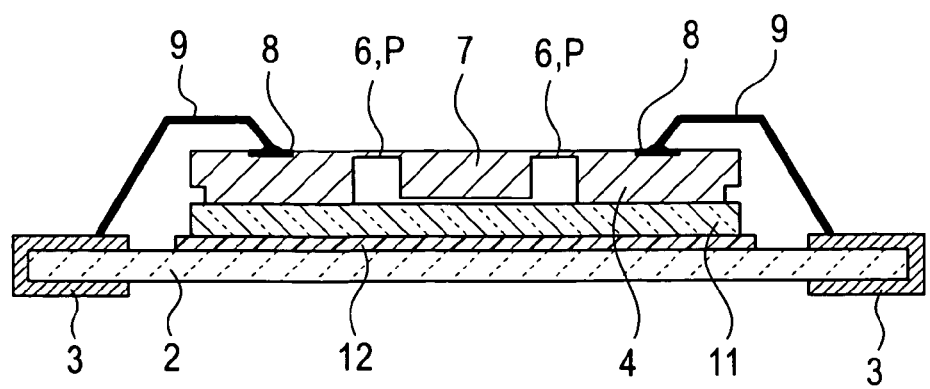
FIG. 16 is a diagram depicting the manufacturing step EA of the semiconductor acceleration sensor according to Embodiment 3.
Figure 17:
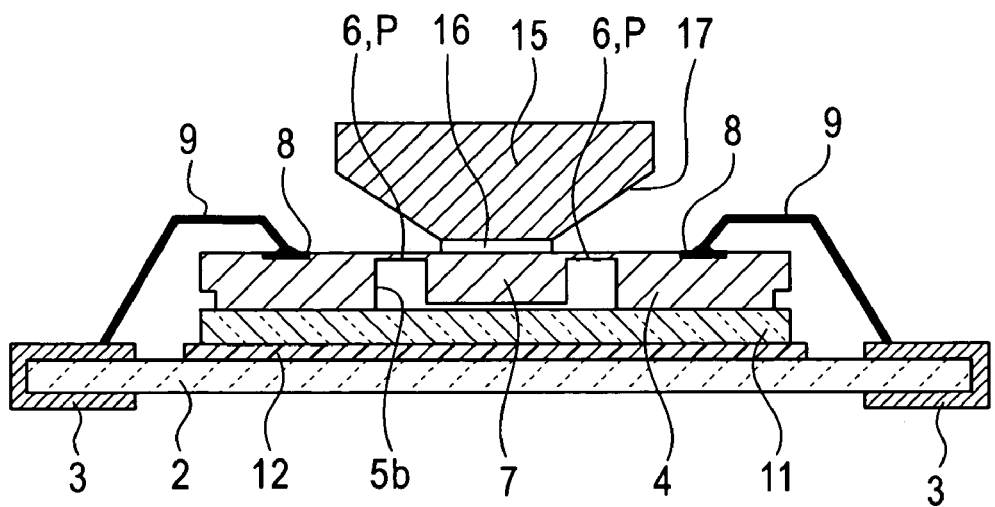
FIG. 17 is a diagram depicting the manufacturing step FA of the semiconductor acceleration sensor according to Embodiment 3.
Figure 18:
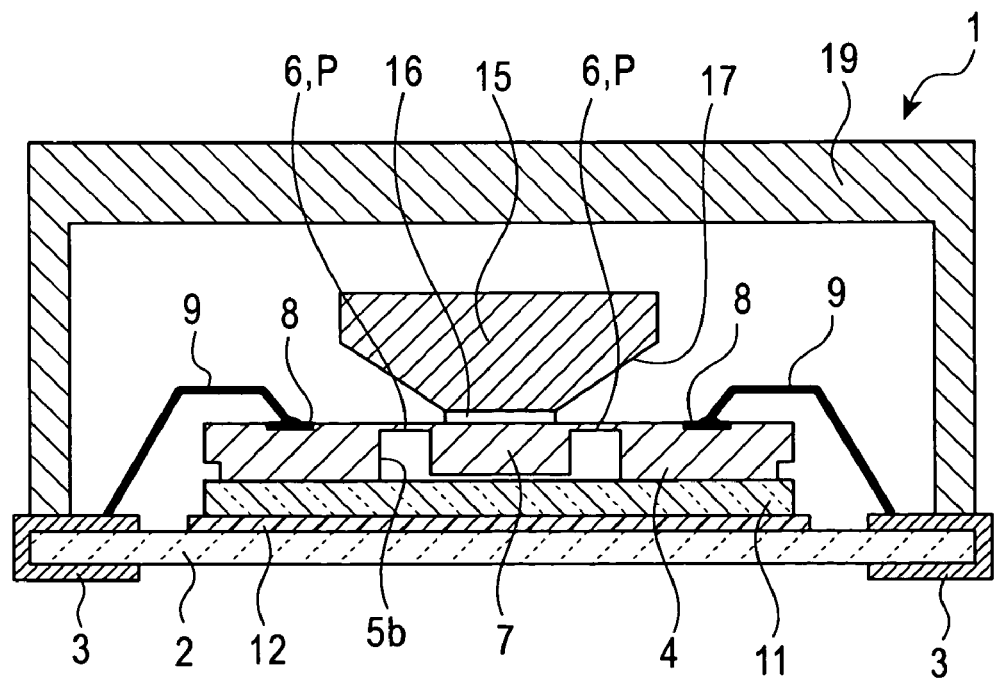
FIG. 18 is a diagram depicting the manufacturing step GA of the semiconductor acceleration sensor according to Embodiment 3.

The operations of steps DA to FA, shown in FIG. 15 to FIG. 17, are the same as the operations in step C to E of Embodiment 1, so description thereof is omitted. In step GA, after the additional weight 15 is bonded to the front surface of the weight section 7 of the chip main body 4, the bottom faces of the side plates of the cover unit 19 are bonded to the substrate 2, and the chip main body 4 and the additional weight 15 are contained in the space created by the cover unit 19 and the substrate 2, and the manufacture of the semiconductor acceleration sensor 1 shown in FIG. 18 is completed.

In the present embodiment, roughness was shown for the first blade 42 and the second blade 44, but the materials and the size of the first and second blades may be set appropriately.

As described, according to the present embodiment, the cutting guide trenches are formed on the back surface of the wafer, and the wafer and the glass plate are cut in separate steps using the first blade 42 and the second blade 44, so the interface formed by hetero-materials need not be cut, and peeling of the wafer from the glass plate can be prevented, in addition to effects similar to Embodiment 1.

In each of the above embodiments, the step of bonding the additional weight is executed after the step of wiring the chip electrodes and the terminals by bonding wires, but the step of bonding the addition weight may come first, and the step of bonding by bonding wires may come next.

In the above description, the back plate made of glass is bonded on the back surface of the chip main body, but the back plate to be bonded on the back surface of the chip main body is not limited to the above, but may be a thin plate made of silicon or metal.

What is claimed is:

1. A semiconductor acceleration sensor, comprising:
a weight section, which has a first surface;
flexible sections, which support the weight section and have measurement elements;
a chip main body, which has a second surface having chip electrodes electrically connected to the measurement elements and supports the flexible sections, wherein the second surface and the first surface are on a same side of said chip main body and at a same level;
the semiconductor acceleration sensor further comprising a bonding section provided on the first surface of the weight section;
an additional weight, which has a bottom surface, wherein the bottom surface is connected to the bonding section of the weight section;
a substrate, which has terminals, and mounts the chip main body; and
bonding wires for electrically connecting the chip electrodes and the terminals;
wherein the additional weight has an inclined face, which surrounds the bonding section, and said additional weight reduces in size toward the bonding section and toward the bottom surface of said additional weight.

2. The semiconductor acceleration sensor according to claim 1, wherein the weight section is substantially a quadrangular prism externally contacting the bottom surface of the additional weight.

3. The semiconductor acceleration sensor according to claim 1, further comprising:
- a third surface at an opposite side of the first surface of the weight section;
- a fourth surface at an opposite side of the second surface of the chip main body; and
- a back plate, which is provided on the fourth surface and extends under the weight section, wherein
- a space is provided between the back plate and the third surface of the weight section.

4. The semiconductor acceleration sensor according to claim 2, further comprising:
- a third surface at anopposite side of the first surface of the weight section;
- a fourth surface at an opposite side of the second surface of the chip main body; and
- a back plates which is provided on the fourth surface and extends under the weight section, wherein
- a space is provided between the back plate and the third surface of the weight section.

5. The semiconductor acceleration sensor according to claim 1, wherein at least one of the chip electrodes is disposed near the inclined face of the additional weight.

6. The semiconductor acceleration sensor according to claim 2, wherein at least one of the chip electrodes is disposed near an inclined face of the additional weight.

7. The semiconductor acceleration sensor according to claim 3, wherein at least one of the chip electrodes is disposed near an inclined face of the additional weight.

8. The semiconductor acceleration sensor according to claim 4, wherein at least one of the chip electrodes is disposed near an inclined face of the additional weight.

* * * * *